(12) United States Patent
Mochizuki

(10) Patent No.: US 7,942,194 B2
(45) Date of Patent: May 17, 2011

(54) HEAT SINK

(75) Inventor: Masataka Mochizuki, Tokyo (JP)

(73) Assignee: Fujikura Ltd., Tokyo (JP)

( * ) Notice: Subject to any disclaimer, the term of this patent is extended or adjusted under 35 U.S.C. 154(b) by 823 days.

(21) Appl. No.: 11/834,738

(22) Filed: Aug. 7, 2007

(65) Prior Publication Data

US 2008/0251239 A1     Oct. 16, 2008

Related U.S. Application Data

(60) Provisional application No. 60/911,020, filed on Apr. 10, 2007.

(51) Int. Cl.
*F28D 15/02* (2006.01)
(52) U.S. Cl. .................. 165/80.3; 165/104.21
(58) Field of Classification Search ............. 165/104.21, 165/104.33, 80.3
See application file for complete search history.

(56) References Cited

U.S. PATENT DOCUMENTS

| | | |
|---|---|---|
| 4,633,371 A | 12/1986 | Nagy et al. |
| 6,102,110 A | 8/2000 | Julien et al. |
| 6,725,909 B1 | 4/2004 | Luo |
| 6,745,824 B2 | 6/2004 | Lee et al. |
| 6,845,010 B2 | 1/2005 | Lee |
| 6,894,900 B2 | 5/2005 | Malone |
| 7,089,999 B1 | 8/2006 | Wu et al. |
| 7,128,135 B2 | 10/2006 | Mok et al. |
| 7,140,422 B2 | 11/2006 | Malone et al. |
| 7,140,423 B2 | 11/2006 | Chang |
| 7,143,816 B1 | 12/2006 | Ghosh et al. |
| 7,143,819 B2 | 12/2006 | Malone et al. |
| D541,757 S | 5/2007 | Lee et al. |
| 7,269,013 B2 | 9/2007 | Chen et al. |
| D561,711 S | 2/2008 | Lin |
| D576,963 S | 9/2008 | Mochizuki et al. |
| D593,511 S | 6/2009 | Deng et al. |
| 7,540,319 B2 | 6/2009 | Mochizuki et al. |
| D597,498 S | 8/2009 | Zhao et al. |
| 2005/0011633 A1 | 1/2005 | Garner et al. |
| 2005/0103476 A1 | 5/2005 | Chen et al. |
| 2005/0274487 A1* | 12/2005 | Goth ............................ 165/80.2 |
| 2005/0280996 A1 | 12/2005 | Erturk et al. |
| 2006/0102325 A1 | 5/2006 | Li et al. |
| 2006/0219386 A1 | 10/2006 | Hsia et al. |
| 2006/0238979 A1* | 10/2006 | Liu ................................ 361/699 |
| 2007/0277958 A1 | 12/2007 | Huang |
| 2008/0128118 A1* | 6/2008 | Chen et al. ............... 165/104.33 |
| 2008/0310105 A1 | 12/2008 | Cheng |

FOREIGN PATENT DOCUMENTS

CN         2775837 Y      4/2006
(Continued)

OTHER PUBLICATIONS

U.S. Appl. No. 11/840,969, filed Aug. 19, 2007, by Masataka Mochizuki.

*Primary Examiner* — Teresa J Walberg
(74) *Attorney, Agent, or Firm* — Sughrue Mion, PLLC

(57) ABSTRACT

A heat sink, wherein a plurality of heat radiation fins are mounted on a base plate to which an electronic device is attached in a heat transmittable manner. The heat radiation fins are erected vertically and in parallel with each other on the reverse face of the base plate to which the electron device is contacted, and extended laterally from the base plate. A heat pipe transports heat between the extended portion of the heat radiation fins and the base plate.

7 Claims, 6 Drawing Sheets

FOREIGN PATENT DOCUMENTS

| | | |
|---|---|---|
| CN | 1782650 A | 6/2006 |
| CN | 2842729 Y | 11/2006 |
| CN | 101098605 A | 1/2008 |
| JP | 2001-024374 A | 1/2001 |
| JP | 2004-111966 A | 4/2004 |
| TW | 252255 M | 12/2004 |

* cited by examiner

HEAT SINK

CROSS-REFERENCE TO RELATED APPLICATION

This application claims benefit of U.S. Provisional Application No. 60/911,020 filed Apr. 10, 2007; the entire disclosure thereof which is incorporated by reference.

BACKGROUND OF THE INVENTION

1. Field of the Invention

The present invention deals with a heat sink for cooling an electron device or electronic device such as an IC (i.e., Integrated Circuit) or an IC chipset by radiating heat thereof into the air.

2. Discussion of the Related Art

U.S. Pat. Nos. 6,102,110 and 7,143,819 disclose devices for cooling an electron device by transporting heat generated by the electron device to a portion away from a contact portion of the electron device to radiate the heat therefrom. According to the structure taught by U.S. Pat. No. 6,102,110, one of the end portion of a plurality of heat exchange tubes are secured in a rigid plate, and the other end portion of the heat exchange tubes are protruded from the rigid plate. A plurality of heat radiation fins are mounted on the protruded portion of the heat exchange tubes and electronic power components are attached to the rigid plate. Therefore, heat of the electronic power components are transported to the fins through the heat exchange tubes, and radiated from the fins into the air.

Meanwhile, U.S. Pat. No. 7,143,819 discloses a heat sink, in which an L-shaped or a U-shaped heat pipe provided with heat radiation fins is directly contacted with an electronic component. According to the heat sink suggested by U.S. Pat. No. 7,143,819, heat of the electronic component is transported to the fins through the heat pipe, and radiated from the fins into the air.

Additionally, in the prior art, there is known a heat sink, in which a plurality of heat radiation fins are provided on a top face of a base plate, and a heat receiving portion to be contacted with an electronic component is formed on a bottom face of the base plate.

However, the heat sink or the radiation device suggested by U.S. Pat. Nos. 6,102,110 and 7,143,819 transports the heat of the electron device to the fins by the heat pipe. This means that a large quantity of heat pipes are necessary for those prior art devices. For this reason, such prior art devices have to be dimensionally enlarged and a manufacturing cost thereof also be increased.

As to the aforementioned heat sink of the prior art, in which a plurality of heat radiation fins are provided on a top face of a base plate, the base plate is made of a metal sheet so that the heat capacity thereof is large. This means that thermal resistance between the electron device and the heat radiation fins is large, and this degrades the cooling performance to cool the electron device. Additionally, the heat radiation from the fins is promoted by the air flowing around the fins; however, the direction of the airflow is restricted to the direction in parallel with the top face of the base plate. For this reason, heat radiating efficiency of the heat sink of this kind is not sufficiently high enough.

SUMMARY OF THE INVENTION

It is an object of the present invention to provide a heat sink capable of cooling an electron device efficiently, by radiating heat of the electron device efficiently into the air. More specifically, an object of the present invention is to provide a heat sink, which has an enlarged substantial heat radiation area, and which allows the air to flow between heat radiation fins in various directions. Another object of the invention is to reduce thermal resistance between the electron device and the heat radiation fins.

According to the heat sink of the present invention, the heat radiation fins are structured to enhance its heat transporting capability, and the heat pipe is employed as an auxiliary heat transfer means to support mainly a heat radiating portion of the fins. For this purpose, the heat radiating fins are extended laterally from a base plate to which an electron device is attached so as to promote a vertical moving of the air flowing therebetween. In case of natural cooling, for example, ascent of the airflow whose temperature is raised as a result of a heat radiation is promoted. Moreover, in case of carrying out a compulsory cooling using a fan, the air is promoted to flow downwardly and the base plate to which the electron device is contacted is thereby cooled. In order to dissipate the heat more efficiently, the heat pipe is arranged to connect the extended portion of the heat radiation fins and the base plate.

Specifically, the heat sink of the present invention comprises a base plate to which an electron device is attached in a heat transmittable manner, and a plurality of heat radiation fins mounted on the base plate. The heat radiation fins are erected vertically and in parallel with each other on the reverse side of the face to which the electron device is contacted. Those heat radiation fins are extended laterally from the base plate, and a heat pipe is provided to transport the heat between the extended portion of the heat radiation fins and the base plate.

Preferably, the base plate is a vapor chamber comprising a flat hollow container, and a volatilizable and condensable working fluid encapsulated in the container.

An area of a face of the vapor chamber where the heat radiation fins are erected is preferably more than two times larger than the actual contacting area of the electron device.

The aforementioned heat pipe is preferably arranged to be contacted with the base plate on the face where the heat radiation fins are erected. It is also preferable to arrange a plurality of the heat pipe.

Additionally, according to the present invention, grease for transferring heat may be interposed between the base plate and the electron device.

Further, the base plate as the vapor chamber can be thinned by fitting a reinforcement frame therewith. The thermal resistance of the base plate is thereby further lowered, and the heat radiating characteristics is consequently improved.

BRIEF DESCRIPTION OF THE DRAWINGS

These and other features, aspects, and advantages of the present invention will become better understood with reference to the following description and accompanying drawings, which should not be read to limit the invention in any way, in which.

DETAILED DESCRIPTION OF THE INVENTION

Figure 1:
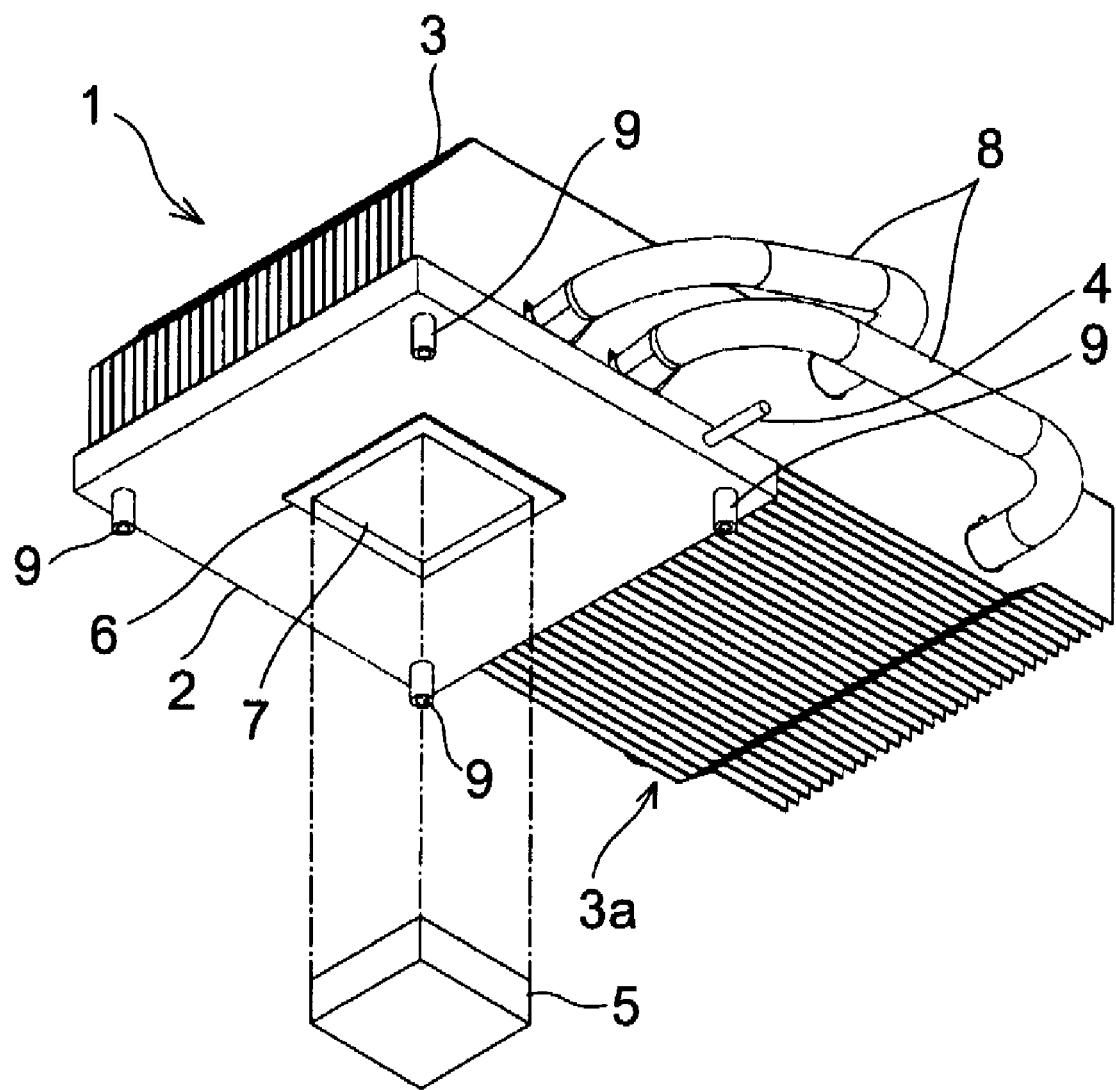
FIG. 1 is a perspective view showing one example of a heat sink according to the invention.
Figure 2:
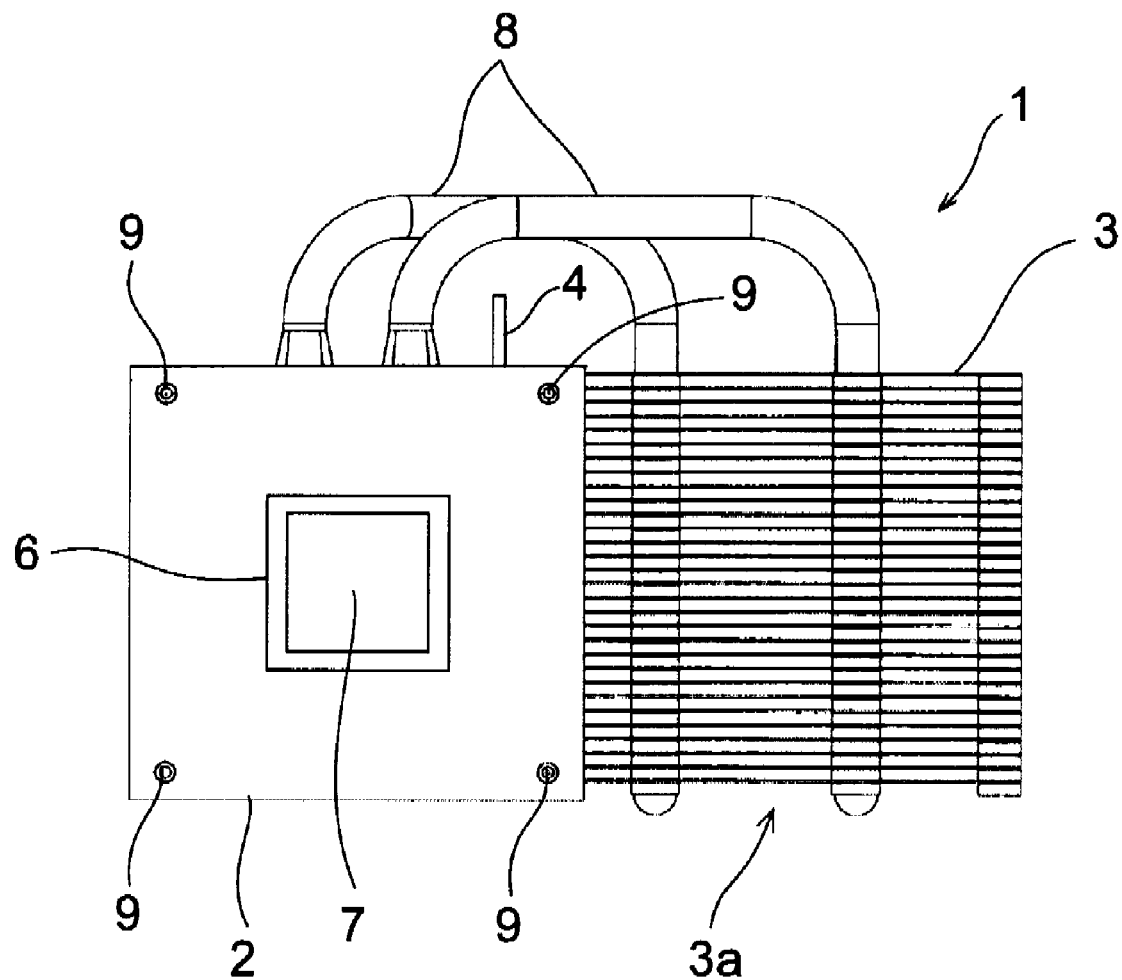
FIG. 2 is a bottom view of the heat sink shown in FIG. 1.
Figure 3:
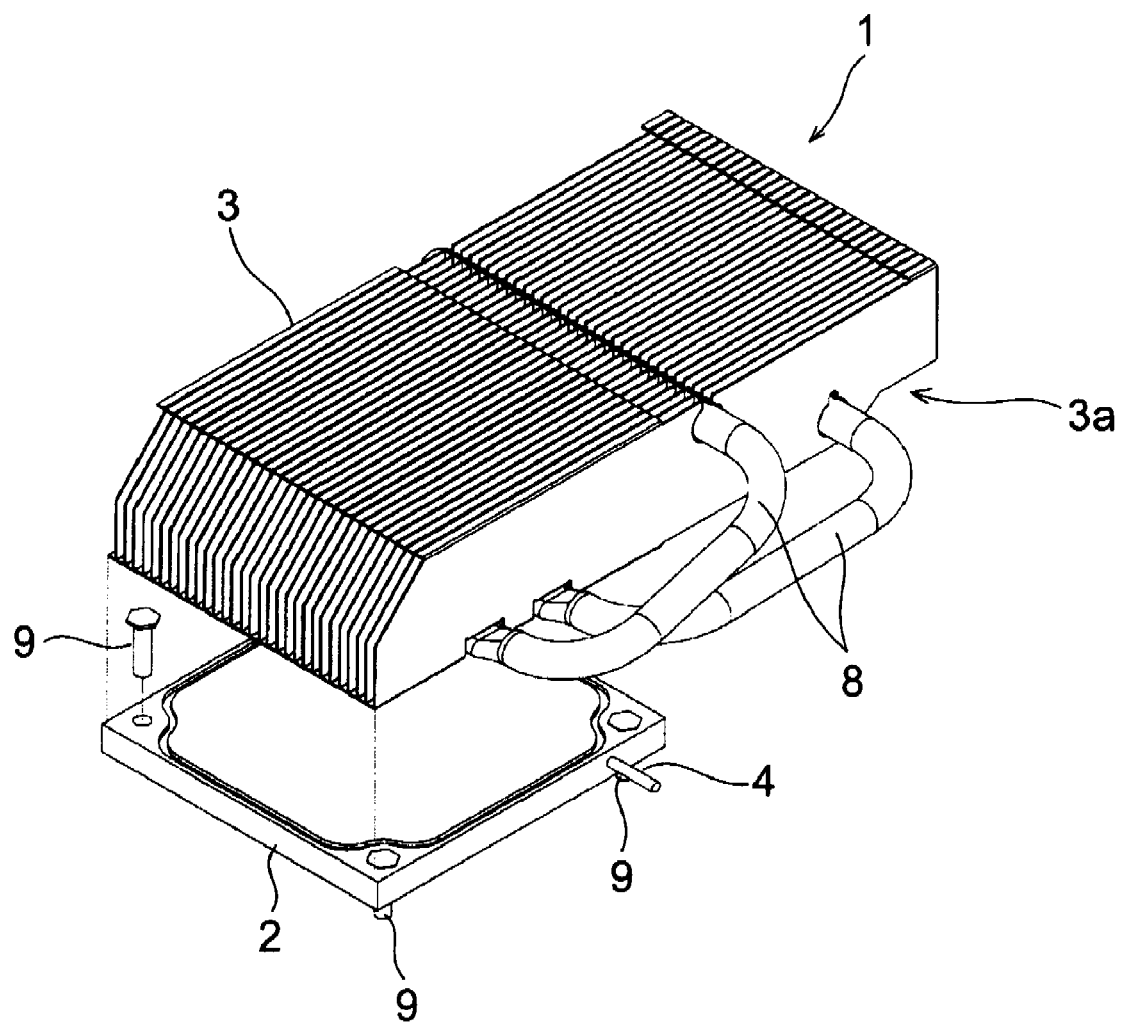
FIG. 3 is an exploded perspective view of the heat sink shown in FIG. 1.

One example of the present invention is illustrated in FIGS. 1 to 3. The illustrated heat sink 1 comprises a base plate 2 and a plurality of heat radiation fins 3 erected integrally on an upper face of the base plate 2. A shape of the base plate 2 may be determined arbitrarily. For example, the base plate 2 may be formed into a geometrically refined shape such as a square shape, a rectangular shape or a circular shape. Otherwise, the base plate 2 may also be shaped into an irregular shape such as a star shape. The base plate 2 may be a flat heat pipe or a flat vapor chamber. The flat heat pipe or vapor chamber is a device for transporting heat comprising an evacuated hollow container, and a condensable working fluid such as water encapsulated in the container. In the heat pipe or vapor chamber, the heat is transported in the form of latent heat of the working fluid. In FIGS. 1 to 3, a reference numeral 4 represents a nozzle. The air is evacuated from the nozzle 4 and the vapor chamber or heat pipe is infused with the working fluid from the nozzle 4.

A heat receiving portion 6 is formed on a lower face (i.e., a bottom face) of the base plate 2 as a flat heat pipe or vapor chamber. To the heat receiving portion 6, an electron device 5 to be cooled is contacted in a heat transmittable manner. A contacting area between the heat receiving portion 6 and the electron device 5 is smaller than half the area of the upper face (i.e., the face on which the heat radiation fins 3 are erected) of the base plate 2. On a top face of the heat receiving portion 6, there is provided thermal grease 7 for facilitating a heat transfer between the heat receiving portion 6 and the electron device 5. The thermal grease 7 is prepared by mixing powder having good heat conductivity such as metal powder into the grease, and adhesiveness and heat conductivity between the heat receiving portion 6 and the electron device 5 are thereby improved.

A plurality of heat radiation fins 3 are erected on the upper face of the base plate 2. The heat radiation fins 3 are made of a thin metal plate having good heat conductivity such as aluminum or an aluminum alloy, and soldered integrally with the upper face of the base plate 2 in parallel with each other at regular interval. That is, the heat radiation fins 3 are erected vertically on the upper face of the base plate 2. Additionally, the heat radiation fins 3 may be integrally fit together by orthogonally bending a predetermined portion thereof such as a lower end portion or a leading end portion, and connecting the adjoining fins.

Length of the heat radiation fins 3 is longer than the width of the base plate 2. Therefore, an end portion of the heat radiation fins 3 opposite to the end portion fixed to the base plate 2 is extended to protrude significantly from the base plate 2. For this reason, a clearance between an extended portion (i.e., the portion protrude from the base plate 2) 3a of the heat radiation fins 3 is opened not only to the longitudinal direction along the upper face of the base plate 2 but also to the vertical direction with respect to the base plate 2.

Further, there is provided a heat pipe 8 for transporting the heat between the extended portion 3a of the heat radiation fins 3 and the upper face of the base plate2. The heat pipe 8 is a hollow pipe which is bent into U-shape, and which functions as a container. Also, the heat pipe 8 is evacuated and a condensable working fluid such as water is encapsulated therein. That is, the heat pipe 8 is a heat transfer device for transferring heat in the form of latent heat of the working fluid. In the examples illustrated in the accompanying figures, there are provided two heat pipes 8. One of the end portions of the heat pipes 8 penetrate a lower portion of the heat radiation fins 3, and contacted with the upper face of the base plate 2. More specifically, the heat pipes 8 are arranged vertically with respect to the heat radiation fins 3, and intermediate portions of the heat pipes 8 are laterally exposed out of the heat radiation fins 3. On the other hand, the other end portions of the heat pipes 8 are inserted into the extended portion 3a of the heat radiation fins 3 from the side face of the heat radiation fins 3, and contacted with the heat radiation fins 3 in a heat transmittable manner. Therefore, the heat is transmitted to the extended portion 3a of the heat radiation fins 3 not only by heat conduction of the heat radiation fins 3 itself but also by the heat pipes 8 directly from the base plate 2. Here, a reference numeral 9 represents a standoff in FIGS. 1 to 3.

Next, here will be explained an action of the heat sink 1. The electron device 5 which is to be cooled is contacted with the heat receiving portion 6 formed in the lower face of the base plate 2 through the thermal grease 7. Therefore, the heat generated by the electron device 5 is transmitted to around the center of the lower face of the base plate 2 through the thermal grease 7. As explained above, the base plate 2 is a heat pipe or a vapor chamber and the working fluid thereof is vaporized by the heat transmitted from the electron device 5. Since the heat radiation fins 3 and the heat pipes 8 are mounted on the upper face of the base plate 2 so that the temperature thereof is relatively low, the vapor of the working fluid ascends in the base plate 2 to the upper face side, and then contacts with the upper face of the base plate 2. Consequently, the heat is radiated and the vapor of the working fluid is again condensed. In short, the heat is transported by the vaporized working fluid in the form of latent heat. According to the invention, since the area of the upper face (i.e., the face on which the heat radiation fins 3 are erected) of the base plate 2 is more than two times larger than the area of the actual contacting area of the electron device 5, the heat of the electron device 5 can be transmitted to the heat radiation fins 3 more efficiently in comparison with the case in which a copper whose thermal conductivity is the best is used. That is, the heat can be transported sufficiently to cool the electron device 5.

The latent heat of the working fluid reaching the upper face of the base plate 2 spreads all over the upper face of the base plate 2, and then transmitted to the heat radiation fins 3 and the heat pipes 8. The heat transmitted to the heat radiation fins 3 propagates all over the heat radiation fins 3, and the heat is diffused into the ambient air. That is, the heat of the electron device 5 is diffused into the air so that the electron device 5 is cooled. In addition to the heat conduction of the heat radiation fins 3, the heat of the base plate 2 is also transmitted directly to the extended portion 3a of the heat radiation fins 3 by the heat pipe 8. Therefore, the heat is transmitted sufficiently to the portion of the heat radiation fins 3 away from the base plate 2 such as the extended portion 3a. Moreover, in the extended portion 3a, clearances between the heat radiation fins 3 open also to the vertical direction so that the air heated by the heat radiation fins 3 can flow upwardly in the clearance. For this reason, the heat exchange between the heat radiation fins 3 and the air is promoted so that the heat can be radiated efficiently.

Thus, according to the heat sink 1 of the present invention, the base plate 2, to which the electron device 5 is attached and which transmits the heat to the heat radiation fins 3, is a flat heat pipe or vapor chamber. Therefore, the thermal resistance between the electron device 5 and the heat radiation fins 3 can be reduced. Additionally, according to the present invention, an upward flow of the air is generated in the extended portion 3a of the heat radiation fins 3, and the air flows upwardly in the clearance between the heat radiation fins 3. Therefore, it is possible to enhance the heat transfer coefficient and heat exchange amount between the heat radiation fins 3 and the air so that the heat can be radiated efficiently. Consequently, the heat radiation efficiency of the electron device 5 is improved, and the electron device 5 is thereby cooled efficiently.

Here will be explained another example of the present invention with reference to the accompanying FIGS. 4 to 6. The heat sink illustrated in FIGS. 4 to 6 comprises a frame 10 which is attached to the lower face (or bottom face) of the base plate 2. The frame 10 functions mainly as a reinforce member of the base plate 2. For this reason, base plate 2 of this example is thinner than the base plate 2 of the heat sink shown in FIGS. 1 to 3.

A contour of the frame 10 is identical to that of the base plate 2, and in the center of the frame 10, there is formed an opening 11 whose outline is similar to that of the heat receiving portion 6 but larger than the heat receiving portion 6. The remaining construction of the heat sink 1 illustrated in FIGS. 4 to 6 is similar to that in FIGS. 1 to 3, so further description will be omitted by allotting common reference numerals to FIGS. 4 to 6.

Figure 4:
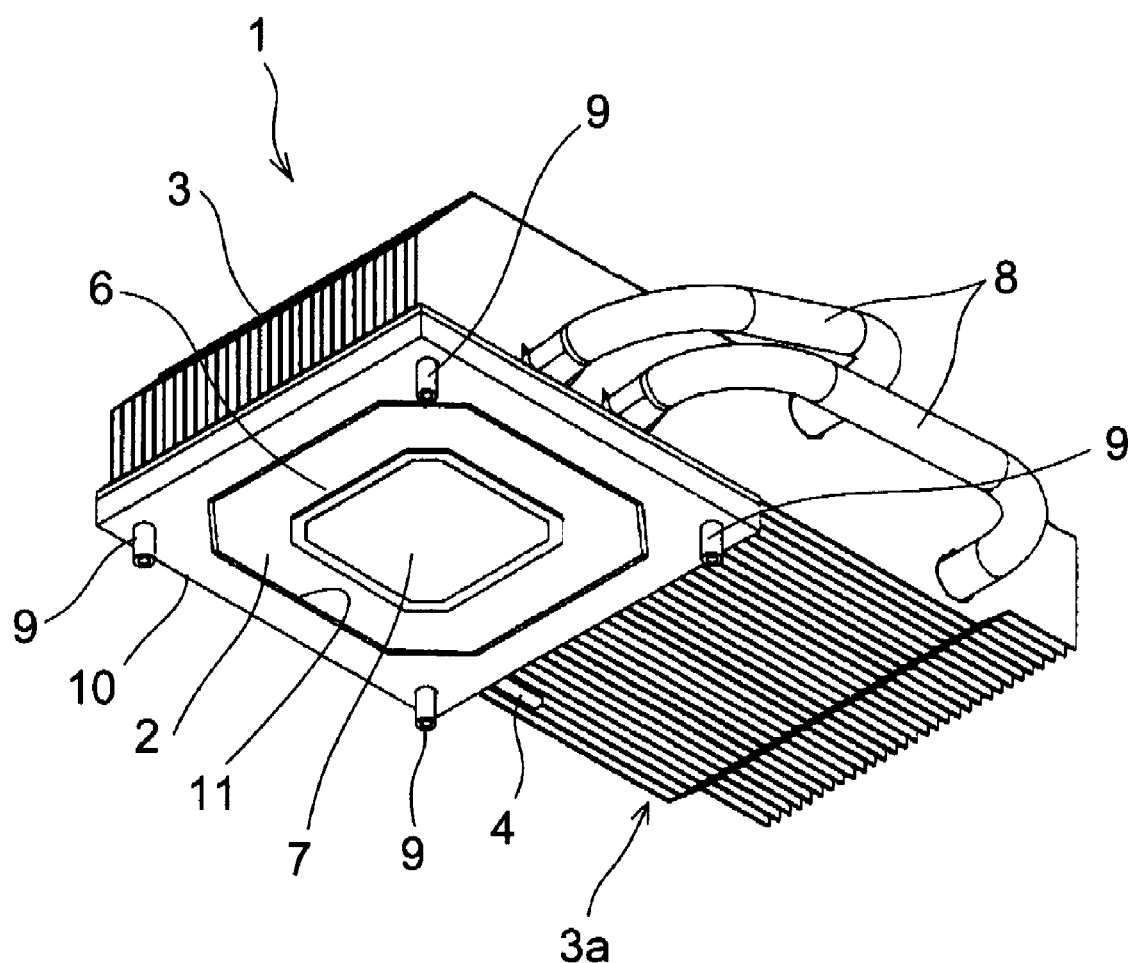
FIG. 4 is a perspective view showing another example of a heat sink according to the invention.
Figure 5:
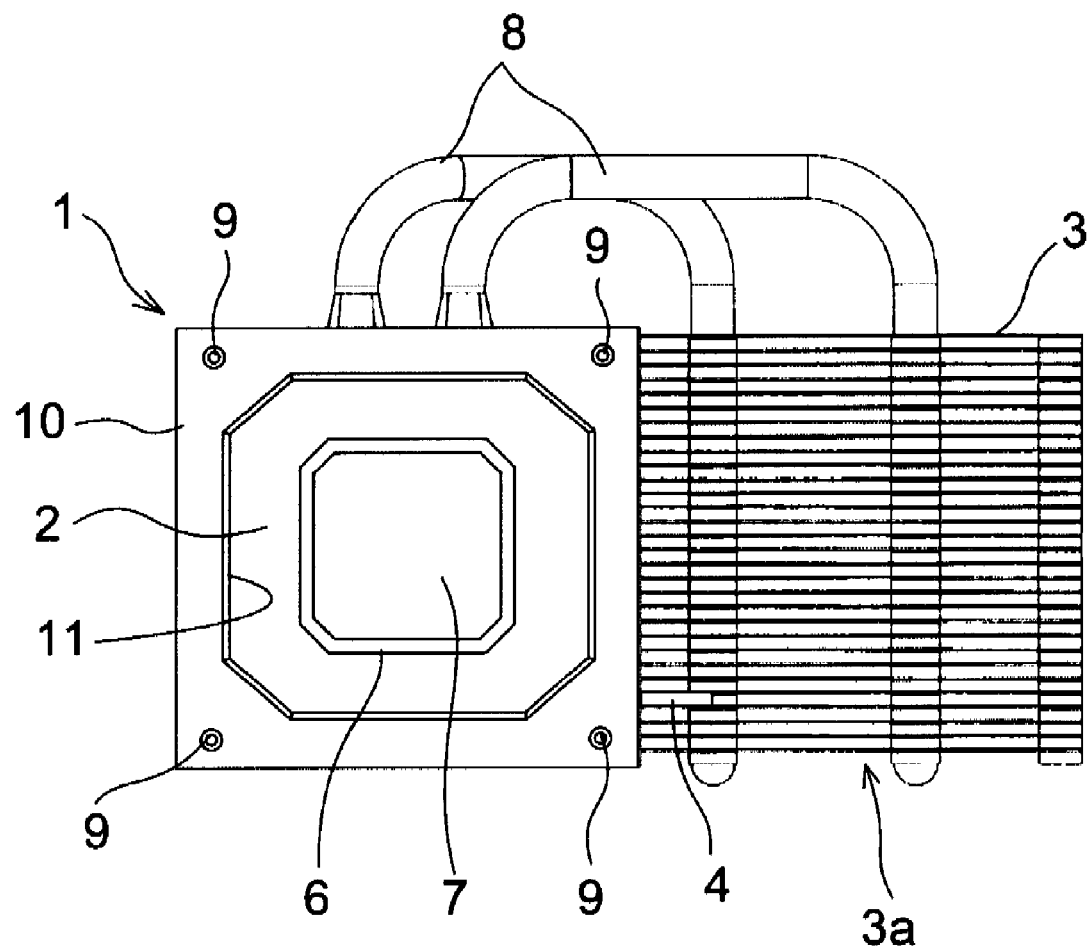
FIG. 5 is a bottom view of the heat sink shown in FIG. 4.
Figure 6:
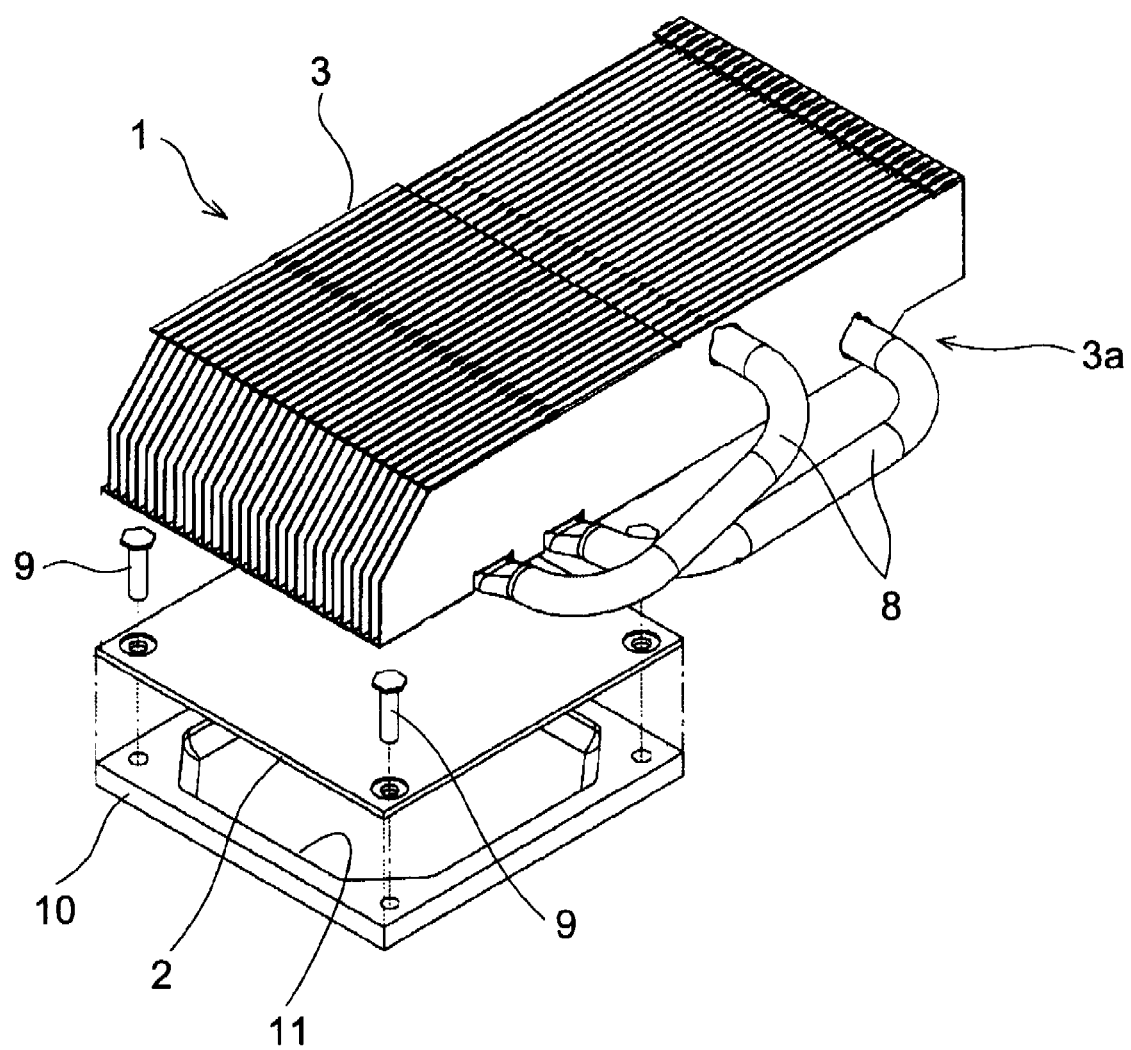
FIG. 6 is an exploded perspective view of the heat sink shown in FIG. 4.

In the heat sink 1 illustrated in FIGS. 4 to 6, the base plate 2 as a flat heat pipe or vapor chamber has an area two times larger than that of the heat receiving portion 6 to which the electron device 5 is attached. Therefore, the heat of the electron device 5 can be transmitted all over the heat radiation fins 3. The heat is also transmitted to the extended portion 3a of the heat radiation fins 3 through the heat pipes 8, the heat radiating area can be substantially enlarged and the heat conductivity of the heat radiation fins 3 itself can be substantially improved. Further, as explained above, an upward flow of the air is generated in the extended portion 3a of the heat radiation fins 3, and the air is allowed to flow upwardly in the clearance between the heat radiation fins 3. For this reason, the heat can be radiated efficiently. Thus, the heat sink 1 illustrated FIGS. 4 to 6 can also radiate the heat of the electron device 5 efficiently so as to cool the electron device 5, as the heat sink 1 illustrated FIGS. 1 to 3.

Moreover, the heat sink according to the present invention also has a beneficial effect in case of carrying out a compulsory cooling. Specifically, in case of flowing cooling air from the base plate 2 side by a not shown fan, the air is flown in parallel with the upper face of the base plate 2 between the heat radiation fins 3, and then comes out from between the leading end side of the heat radiation fins 3 extended laterally from a base plate 2 in both forward and vertical directions. The air blowing out downwardly from the leading end 3a of the heat radiation fins 3 will contact with a not shown board to which the electron device 5 is attached. For this reason, the board or a not shown parts attached thereto can be cooled compulsory.

Here, the number of the heat pipe for transporting the heat to the extended portion 3a of the heat radiation fins 3 is not limited to two pipes but may be one pipe or more than three pipes. Also, it is possible to flatten the end portion of the heat pipe of the base plate side so as to enlarge the contacting area with the base plate. As to the length of the heat radiation fins, it may be around two times longer than the width of the base plate. In addition, according to the invention, the heat receiving portion is not limited to be situated in the center of the lower face of the base plate as a vapor chamber. The heat receiving portion to which the electron device is contacted may be formed in the portion away from the center of the lower face of the vapor chamber.

What is claimed is:

1. A heat sink, wherein:
a plurality of heat radiation fins are mounted on a base plate to which an electronic device is attached in a heat transmittable manner;
the heat radiation fins are erected vertically and parallel to each other on a reverse face of the base plate to which the electronic device is contacted;
the heat radiation fins comprise an installed portion and an extended portion extending laterally from the base plate, wherein clearances are provided between the heat radiation fins of the extended portion so that the heat radiation fins are open in the vertical direction with respect to the base plate to facilitate vertical airflow through the clearances in the extended portion of the heat radiation fins; and
a heat pipe for transporting heat between the extended portion of the heat radiation fins and the base plate.

2. The heat sink according to claim 1, wherein:
the base plate is a vapor chamber comprising
a hollow flat container, and
a volatilizable and condensable working fluid encapsulated in the container.

3. The heat sink according to claim 2, wherein:
an area of the vapor chamber where the heat radiation fins are erected is more than two times larger than the actual contacting area of the electronic device.

4. The heat sink according to claim 2, wherein:
the heat pipe is arranged to be contacted with an outer face of the base plate where the heat radiation fins are erected.

5. The heat sink according to claim 2, wherein:
a plurality of the heat pipes are provided.

6. The heat sink according to claim 1, wherein:
grease for transferring heat is interposed between the base plate and the electronic device.

7. The heat sink according to claim 1, wherein:
the base plate is fitted with a reinforcement frame.

* * * * *